(12) United States Patent
Chen et al.

(10) Patent No.: US 11,856,728 B2
(45) Date of Patent: Dec. 26, 2023

(54) LIQUID COOLING DEVICE

(71) Applicant: Auras Technology Co., Ltd., New Taipei (TW)

(72) Inventors: Chien-Yu Chen, New Taipei (TW); Wei-Hao Chen, New Taipei (TW); Yuh-Shiuan Liu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/514,577

(22) Filed: Oct. 29, 2021

(65) Prior Publication Data

US 2022/0141998 A1 May 5, 2022

Related U.S. Application Data

(60) Provisional application No. 63/107,075, filed on Oct. 29, 2020.

(30) Foreign Application Priority Data

May 28, 2021 (TW) .................................. 110119541

(51) Int. Cl.
*H05K 7/20* (2006.01)
(52) U.S. Cl.
CPC ................................ *H05K 7/20263* (2013.01)
(58) Field of Classification Search
CPC .. H05K 5/069; H05K 7/1427; H05K 7/20009; H05K 7/20172; H05K 7/202; H05K 7/20281; H05K 7/2029; H05K 7/20445; H05K 7/205; H05K 7/20545
See application file for complete search history.

(56) References Cited

U.S. PATENT DOCUMENTS

| | | | | |
|---|---|---|---|---|
| 4,704,658 | A * | 11/1987 | Yokouchi | H05K 7/203 361/698 |
| 5,021,924 | A * | 6/1991 | Kieda | H01L 23/4336 361/698 |
| 7,007,506 | B2 * | 3/2006 | Kubo | H05K 7/20309 165/170 |
| 7,623,347 | B2 * | 11/2009 | Matsui | H05K 1/189 361/722 |
| 8,245,764 | B2 * | 8/2012 | Eriksen | H01L 23/473 165/80.4 |
| 10,410,955 | B2 * | 9/2019 | Tsai | H01L 23/473 |
| 10,431,524 | B1 * | 10/2019 | Lan | H05K 7/20772 |
| 2002/0184894 | A1 * | 12/2002 | Batchelor | F28F 3/12 62/3.3 |
| 2012/0006523 | A1 * | 1/2012 | Masahiro | F28F 3/12 165/185 |
| 2012/0152482 | A1 * | 6/2012 | Osanai | B22D 19/0072 164/112 |

(Continued)

*Primary Examiner* — Abhishek M Rathod
(74) *Attorney, Agent, or Firm* — MUNCY, GEISSLER, OLDS & LOWE, P.C.

(57) ABSTRACT

A liquid cooling device includes a heat dissipation shell and a dual fin module. The heat dissipation shell includes a cooling cavity, and the dual fin module is fixed in the cooling cavity to separate the cooling cavity into an upper cooling space and a lower cooling space, so that a cooling fluid enters the cooling cavity and flows into the upper cooling space and the lower cooling space to cool a chip in the lower cooling space.

8 Claims, 3 Drawing Sheets

(56) References Cited

U.S. PATENT DOCUMENTS

| | | | | |
|---|---|---|---|---|
| 2014/0090809 A1* | 4/2014 | Mori | .......................... | F28F 3/12 |
| | | | | 165/104.19 |
| 2014/0091453 A1* | 4/2014 | Mori | ...................... | F28F 13/06 |
| | | | | 165/104.33 |
| 2014/0290042 A1* | 10/2014 | Loong | .................... | H05K 13/00 |
| | | | | 29/592.1 |
| 2017/0043437 A1* | 2/2017 | Boday | ................ | H05K 7/20772 |
| 2017/0045307 A1* | 2/2017 | Tsai | ...................... | H01L 23/473 |
| 2018/0213677 A1* | 7/2018 | Wu | ....................... | H01L 23/473 |
| 2020/0359528 A1* | 11/2020 | Tsai | .................. | H05K 7/20281 |

* cited by examiner

LIQUID COOLING DEVICE

RELATED APPLICATIONS

This application claims priority to U.S. Provisional Application Ser. No. 63/107,075, filed Oct. 29, 2020, and claims priority to Taiwan Application Serial Number 110119541, filed May 28, 2021. The disclosures of which are incorporated herein by reference in their entireties.

TECHNICAL FIELD

The present disclosure generally relates to a cooling device. More particularly, the present disclosure relates to a liquid cooling device.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the electronic components such as the central processing unit operating at a proper temperature, fluid cooling devices or air cooling devices are usually used.

As an example, the heat generated by a central processing unit is dissipated to the metal cover of the integrated heat spreader (IHS). Then, the heat is transferred to the cooling device via the integrated heat spreader. Subsequently, the heat is dissipated to a fan through a cooling fluid or a heat pipe to exhaust from the electronic device.

In a current water-cooling heat dissipation process, a working fluid flows into the cold plate through the pipeline. However, there are multiple layers of substances disposed between the cooling liquid and the chip, and the thermal resistance thereof may reduce the heat conduction efficiency. Therefore, there is a need to effectively improve the heat dissipation efficiency of the cooling device.

SUMMARY

One objective of the embodiments of the present invention is to provide a liquid cooling device to effectively improve the heat dissipation efficiency of the cooling device, reduce the working temperature of the electronic products, and improve the working efficiency of the electronic products.

To achieve these and other advantages and in accordance with the objective of the embodiments of the present invention, as the embodiment broadly describes herein, the embodiments of the present invention provides a liquid cooling device including a heat dissipation shell and a dual fin module. The heat dissipation shell includes a cooling cavity and the dual fin module fixed in the cooling cavity to separate the cooling cavity into an upper cooling space and a lower cooling space to allow a cooling fluid entering into the cooling cavity and respectively flowing into the upper cooling space and the lower cooling space to cool a chip located in the lower cooling space.

In one or more embodiments, the dual fin module includes an isolation plate, a plurality of first cooling fins and a plurality of second cooling fins. The first cooling fins are formed on the isolation plate and located in the upper cooling space, and the second cooling fins are formed beneath the isolation plate and located in the lower cooling space.

In one or more embodiments, the lower cooling space further includes a film space located between the chip and the second cooling fins.

In one or more embodiments, the heat dissipation shell further includes a plurality of fixing platforms, and a fixing surface of the isolation plate of the dual fin module is fixed on the fixing platforms to form the film space between the chip and the second cooling fins.

In one or more embodiments, a first cooling fin width of the first cooling fins is equal to or different from a second cooling fin width of the second cooling fins.

In one or more embodiments, the heat dissipation shell includes an inlet and an outlet. A diameter of the outlet is larger than a diameter of the inlet.

In one or more embodiments, the heat dissipation shell further includes two inlet guiding surfaces respectively formed on both sides of the inlet to guide the cooling fluid into the cooling cavity.

In one or more embodiments, the heat dissipation shell further includes two outlet guiding surfaces respectively formed on both sides of the outlet to guide the cooling fluid out of the cooling cavity.

In one or more embodiments, an included angle between the inlet guiding surfaces and the inlet is about 45 degrees to 75 degrees, and an included angle between the outlet guiding surfaces and the outlet is about 45 degrees to 75 degrees.

In one or more embodiments, the liquid cooling device further includes a substrate and an adhesive layer. The chip is fixed on the substrate, the adhesive layer bonds the substrate to the heat dissipation shell, and the adhesive layer includes an epoxy adhesive layer.

Hence, the liquid cooling device can effectively improve the heat dissipation efficiency thereof, the working fluid can directly contact the chip for heat exchange so as to improve the heat transfer efficiency thereof, the liquid cooling device utilizes a tiny distance between the cooling fins and the chip to generate a liquid film by the surface tension so as to transfer the heat generated by the chip to the cooling fins by the liquid film, and then the heat is further removed by the working fluid. In addition, the lower cooling fins can remove most of the heat, and the upper cooling fins can further remove the residual heat so as to effectively improve the heat dissipation efficiency of the liquid cooling device.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
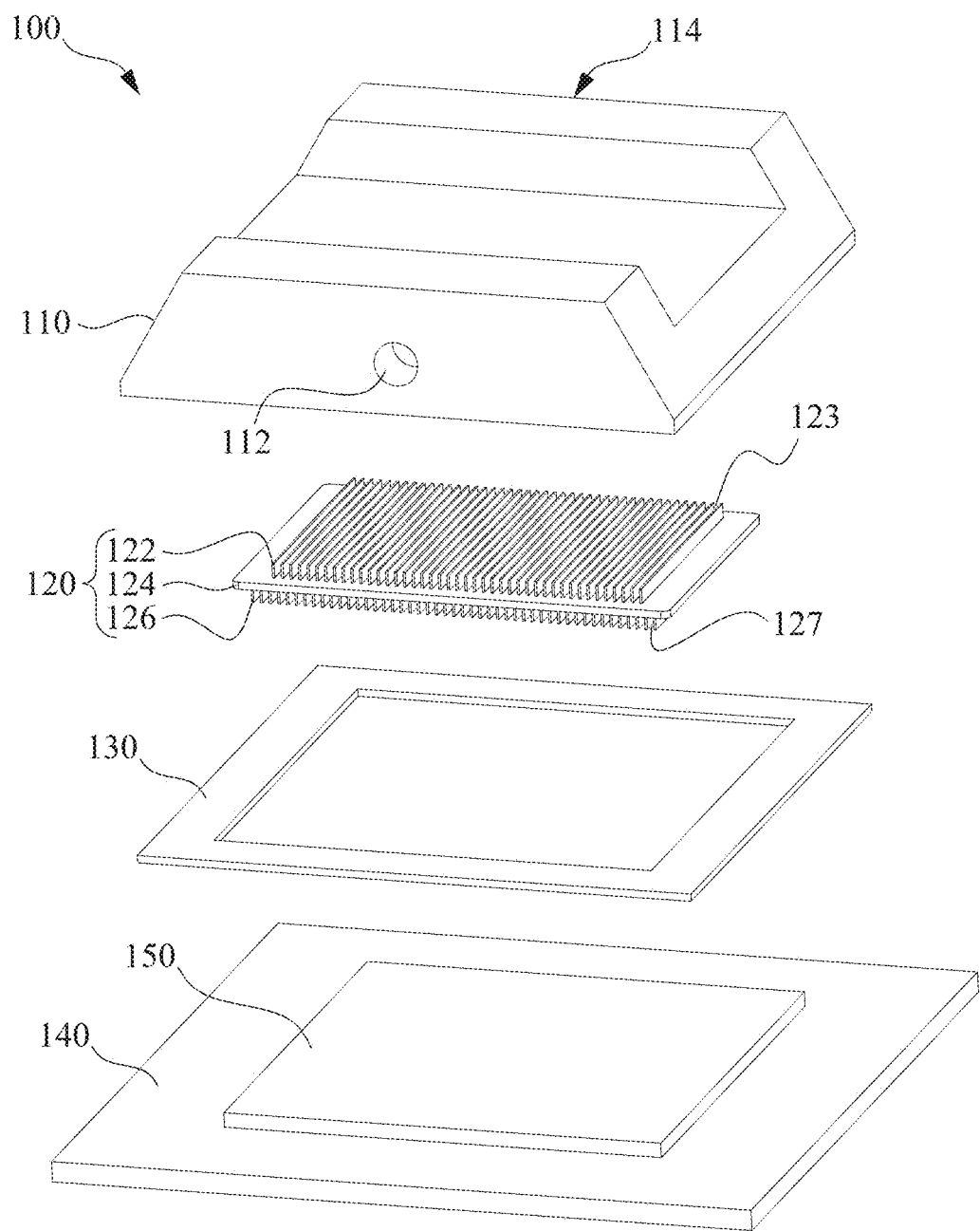
FIG. 1 illustrates a schematic exploded view showing a liquid cooling device according to one embodiment of the present invention.
Figure 2:
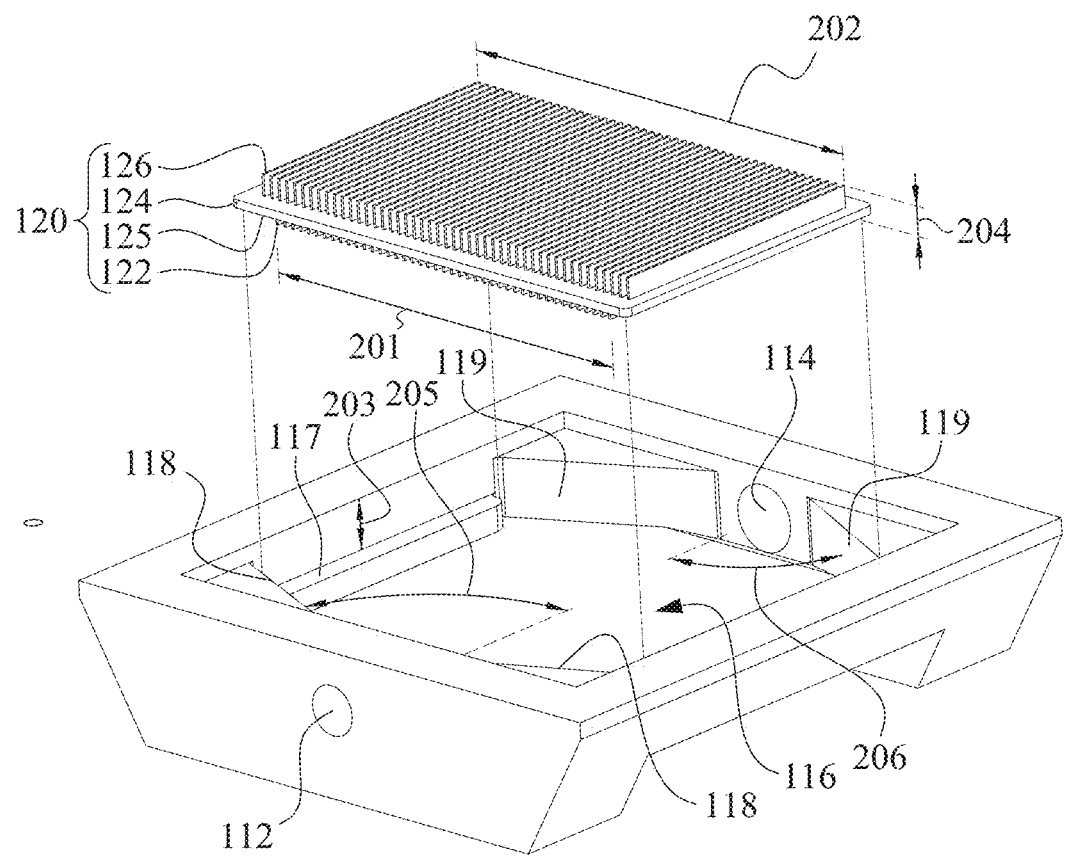
FIG. 2 illustrates another schematic perspective view showing a heat dissipation shell and a dual fin module of the liquid cooling device of FIG. 1.
Figure 3:
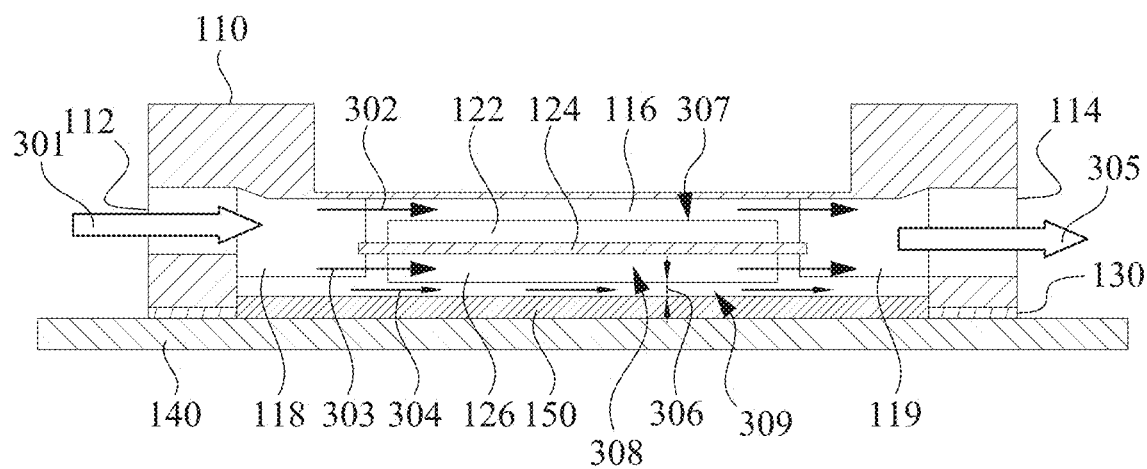
FIG. 3 illustrates a schematic partial cross-sectional view of the liquid cooling device of FIG. 1.

FIG. 1 is a schematic exploded view showing a liquid cooling device according to one embodiment of the present invention, FIG. 2 is another schematic perspective view showing a heat dissipation shell and a dual fin module of the liquid cooling device viewed from another angle, and FIG. 3 is a schematic partial cross-sectional view of the liquid cooling device.

Referring to FIG. 1 and FIG. 2, the liquid cooling device 100 includes a heat dissipation shell 110, a dual fin module 120, an adhesive layer 130, a substrate 140 and a chip 150.

The heat dissipation shell 110 includes a cooling cavity 116, and the dual fin module 120 is fixed in the cooling cavity 116. Further referring to FIG. 3, the dual fin module 120 separates the cooling cavity 116 into an upper cooling space 307 and a lower cooling space 308 to allow a cooling fluid to enter into the cooling cavity 116 and then respectively flow into the upper cooling space 307 and the lower cooling space 308 to cool a chip 150 located in the lower cooling space 308.

The chip 150 is fixed on the substrate 140, and the adhesive layer 130 adheres the substrate 140 to the heat dissipation shell 110 to fix the substrate 140 and the heat dissipation shell 110 so that the chip 150 is sealed in the cooling cavity 116 of the heat dissipation shell 110.

In one or more embodiments, the adhesive layer 130 is an epoxy adhesive layer.

In one or more embodiments, the adhesive layer 130 is adhered on four sides of the chip 150 to prevent from a short circuit problem caused by the working fluid contacting the circuit on the substrate 140 when the working fluid flows through a back surface of the chip 150.

In one or more embodiments, the heat dissipation shell 110 includes an inlet 112 and an outlet 114 disposed on two ends of the heat dissipation shell 110. In one or more embodiments, the diameter of the outlet 114 is larger than the diameter of the inlet 112 to improve the cooling efficiency thereof. In particular, a larger outlet diameter is more conducive to the coexistence of liquid and gas to stabilize the cross-sectional areas of the inlet and outlet required for the cooling fluid to enter and exit the cooling fluid when a two-phase fluid is utilized.

In one or more embodiments, the dual fin module 120 includes an isolation plate 124, a plurality of first cooling fins 122 and a plurality of second cooling fins 126. The first cooling fins 122 are formed on the isolation plate 124 and located in the upper cooling space 307, and the second cooling fins 126 are formed beneath the isolation plate 124 and located in the lower cooling space 308. In other words, the isolation plate 124 is sandwiched between the first cooling fins 122 and the second cooling fins 126.

In one or more embodiments, the lower cooling space 308 further includes a film space 309 located between the chip 150 and the second cooling fins 126.

Further referring to FIG. 1 to FIG. 3, in one or more embodiments, after the inlet fluid 301 enters into the cooling cavity 116 from the left as shown in the drawing, the inlet fluid 301 is separated into an upper cooling fluid 302 and a lower cooling fluid 303 by the isolation plate 124 of the dual fin module 120. The lower cooling fluid 303 flows through the surface of the chip 150 by way of the flow passages 127 between the second cooling fins 126 to directly cool the chip 150. The upper cooling fluid 302 flows through the flow passages 123 between the first cooling fins 122 to remove the heat in the isolation plate 124 and the first cooling fins 122 so as to reduce the total temperature of the dual fin module 120 and further reduce the working temperature of the chip 150. The heat is transferred from the second cooling fins 126 of the dual fin module 120 to the isolation plate 124 and the first cooling fins 122.

Therefore, the liquid cooling device 100 can directly or indirectly reduce the temperature of the chip 150 through the dual fin module 120 to effectively reduce the working temperature of the chip 150 and improve the working efficiency of the chip 150.

In addition, a spacing 306 is formed between the second cooling fins 126 and the chip 150 to form a liquid film 304 through a surface tension caused by a small distance between the second cooling fins 126 and the chip 150 to transfer the heat generated by the chip 150 to the cooling fins through the liquid film 304 and the heat is further removed by the working fluid. The dual fin module 120 of the liquid cooling device 100 has two layers of cooling fins, and the lower cooling fins can remove most of the heat and the upper cooling fins can further remove the residual heat to further improve the heat dissipation effect of the liquid cooling device 100.

In one or more embodiments, the dual fin module 120 includes two layers of skived fins and does not contact the chip 150 so as to transfer the heat through the liquid film.

In one or more embodiments, the outlet fluid 305 can be a single-phase or dual-phase liquid, without departing from the spirit and scope of the present invention.

In one or more embodiments, referring to FIG. 2, the heat dissipation shell 110 further includes two fixing platforms 117 to fix to a fixing surface 125 of the isolation plate 124 of the dual fin module 120 to form a film space 309 between the chip 150 and the second cooling fins 126. In one or more embodiments, a height 203 from the bottom surface of the heat dissipation shell 110 to the fixing platforms 117 is larger than or equal to a height 204 from the fixing surface 125 of the isolation plate 124 to an end surface of the second cooling fins 126.

In one or more embodiments, a first cooling fin width 201 is larger than a second cooling fin width 202, but not limited to this. In one or more embodiments, the first cooling fin width 201 may be equal to or not equal to the second cooling fin width 202.

In one or more embodiments, the heat dissipation shell 110 further includes two inlet guiding surfaces 118 respectively located on both sides of the inlet 112 to guide the cooling fluid into the cooling cavity 116. In addition, the heat dissipation shell 110 may also include two outlet guiding surfaces 119 located on both sides of the outlet 114 to guide the cooling fluid out of the cooling cavity 116.

In one or more embodiments, an included angle 205 between the inlet guiding surface 118 and the inlet 112 is about 45 degrees to 75 degrees, and an included angle 206 between the outlet guiding surface 119 and the outlet 114 is about 45 degrees to 75 degrees.

Accordingly, the liquid cooling device can effectively improve the heat dissipation efficiency thereof, the working fluid can directly contact the chip for heat exchange so as to improve the heat transfer efficiency thereof, the liquid cooling device utilizes a tiny distance between the cooling fins and the chip to generate a liquid film by the surface tension so as to transfer the heat generated by the chip to the cooling fins by the liquid film, and then the heat is further removed by the cooling fluid. In addition, the lower cooling fins can remove most of the heat, and the upper cooling fins can further remove the residual heat so as to effectively improve the heat dissipation efficiency of the liquid cooling device.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A liquid cooling device, comprising:
    a heat dissipation shell, wherein the heat dissipation shell comprises a cooling cavity;
    a chip sealed in the cooling cavity; and
    a dual fin module fixed in the cooling cavity to separate the cooling cavity into an upper cooling space and a lower cooling space to allow a cooling fluid entering into the cooling cavity and flowing into the upper cooling space and the lower cooling space to cool the chip located in the lower cooling space of the cooling cavity, wherein the cooling fluid directly contacts the chip located in the lower cooling space of the cooling cavity, wherein the dual fin module comprises:
    an isolation plate;
    a plurality of first cooling fins formed on the isolation plate and located in the upper cooling space; and
    a plurality of second cooling fins formed beneath the isolation plate and located in the lower cooling space,
    wherein the lower cooling space further comprises a film space located between the chip and the second cooling fins to form a liquid film for transferring the heat generated by the chip to the second cooling fins of the dual fin module.

2. The liquid cooling device of claim 1, wherein the heat dissipation shell further comprises a plurality of fixing platforms, and a fixing surface of the isolation plate of the dual fin module is fixed on the fixing platforms to form the film space between the chip and the second cooling fins.

3. The liquid cooling device of claim 2, wherein a first cooling fin width of the first cooling fins is equal to or different from a second cooling fin width of the second cooling fins.

4. The liquid cooling device of claim 1, wherein the heat dissipation shell comprises:
    an inlet; and
    an outlet, wherein a diameter of the outlet is larger than a diameter of the inlet.

5. The liquid cooling device of claim 4, wherein the heat dissipation shell further comprises:
    two inlet guiding surfaces respectively formed on both sides of the inlet to guide the cooling fluid into the cooling cavity.

6. The liquid cooling device of claim 5, wherein the heat dissipation shell further comprises:
    two outlet guiding surfaces respectively formed on both sides of the outlet to guide the cooling fluid out of the cooling cavity.

7. The liquid cooling device of claim 6, wherein an included angle between the inlet guiding surfaces and the inlet is about 45 degrees to 75 degrees, and an included angle between the outlet guiding surfaces and the outlet is about 45 degrees to 75 degrees.

8. The liquid cooling device of claim 1, further comprises:
    a substrate, wherein the chip is fixed on the substrate; and
    an adhesive layer bonding the substrate to the heat dissipation shell, and the adhesive layer comprises an epoxy adhesive layer.

* * * * *